(12) United States Patent
Jang

(10) Patent No.: US 6,174,777 B1
(45) Date of Patent: Jan. 16, 2001

(54) METHOD FOR FABRICATING A SELF ALIGNED CONTACT USING A REVERSE SELF ALIGNED CONTACT ETCH

(75) Inventor: Dowson Jang, Tainan (TW)

(73) Assignee: Taiwan Semiconductor Manufacturing Company, Hsin-Chu (TW)

(*) Notice: Under 35 U.S.C. 154(b), the term of this patent shall be extended for 0 days.

(21) Appl. No.: 09/383,596

(22) Filed: Aug. 26, 1999

(51) Int. Cl.[7] .................. H01L 21/336; H01L 21/3205; H01L 21/4763; H01L 21/464

(52) U.S. Cl. .................. 438/299; 438/199; 438/647; 438/592; 438/669; 438/633; 438/672

(58) Field of Search .................. 438/300, 197, 438/647, 592, 666, 626, 631, 633, 299, 199, 669, 672

(56) References Cited

U.S. PATENT DOCUMENTS

| | | | |
|---|---|---|---|
| 5,571,733 | * 11/1996 | Wu et al. | 438/227 |
| 5,631,185 | * 5/1997 | Kim et al. | 438/397 |
| 5,661,054 | 8/1997 | Kauffman et al. | 438/257 |
| 5,691,238 | 11/1997 | Avanzino et al. | 437/195 |
| 5,753,555 | * 5/1998 | Hada | 438/300 |

* cited by examiner

Primary Examiner—Charles Bowers
Assistant Examiner—Thanhha Pham
(74) Attorney, Agent, or Firm—George O. Saile; Stephen B. Ackerman; William J. Stoffel

(57) ABSTRACT

This invention provides a method for forming a self aligned contact using a reverse self aligned contact etch process. A substrate structure is provided having conductive structures thereon. The conductive structures can be any of a number of structures including, but not limited to: floating gate transistors, capacitors, word lines, or a combination thereof. The substrate structure also has doped regions thereon adjacent to one or both sides of the conductive structures. A polysilicon layer is formed over the conductive structures and the doped regions. A photoresist mask is formed over the polysilicon layer having openings over the conductive structures. The polysilicon layer is etched through the openings in the photoresist mask and stopping on the hard masks to form self aligned contacts over the doped regions. A dielectric layer is formed over the self aligned contacts and the conductive structures. The dielectric layer and the self aligned contacts are planarized.

16 Claims, 3 Drawing Sheets

METHOD FOR FABRICATING A SELF ALIGNED CONTACT USING A REVERSE SELF ALIGNED CONTACT ETCH

BACKGROUND OF INVENTION

1) Field of the Invention

This invention relates generally to fabrication of semiconductor devices and more particularly to a reverse self aligned contact etch process.

2) Description of the Prior Art

The use of self aligned contact (SAC) processes has resulted in higher performing, lower cost, and increased density semiconductor devices. However, the etch to form the contact opening can cause damage to the spacers protecting the sidewalls of the structures adjacent to the contacts. Also, the tops of the structures adjacent to the contacts must withstand a significant overetch for the contact opening to be etched down to the substrate.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,661,054 (Kauffman et al.) shows a self aligned contact process. In order to completely remove the blanket deposited dielectric layer over the doped region, the top of the adjacent gate and silicon or nitride spacers must ondergo a substantial overetch which can cause reliability problems such as leakage.

U.S. Pat. No. 5,691,238 (Avanzino et al.) shows a reverse dual damascene process used to form an interconnect. Avanzino uses a timed etch of a metal layer to form a conductive via projecting up from a planer conductive layer. Avanzino does not address the self alignment and overetch problems solved by the present invention.

SUMMARY OF THE INVENTION

It is an object of the present invention to provide a method for fabricating a self aligned contact plug using a reverse self aligned contact etch.

It is another object of the present invention to provide a method for forming a self aligned contact plug using a wherein adjacent spacers and structures are not subjected to a significant overetch.

It is another object of the present invention to provide a method for forming a self aligned contact plug which is not limited to advance type etcing machines.

It is yet another object of the present invention to provide a reliable and economical method for forming a self aligned contact plug.

To accomplish the above objectives, the present invention provides a method for forming a self aligned contact using a reverse self aligned contact etch process. The conductive layer for the contact is formed prior to the dielectric layer which separates two levels of a semiconductor device. Current self aligned contact processes form the dielectric first. A substrate structure is provided having conductive structures thereon. The conductive structures can be any of a number of structures including, but not limited to: floating gate transistors, capacitors, word lines, or a combination thereof The substrate structure also has doped regions thereon adjacent to one or both sides of the conductive structures. A polysilicon layer is formed over the conductive structures and the doped regions. A photoresist mask is formed over the polysilicon layer having openings over the conductive structures. The polysilicon layer is etched through the openings in the photoresist mask and stopping on the hard masks to form self aligned contacts over the doped regions. A dielectric layer is formed over the self aligned contacts and the conductive structures. The dielectric layer and the self aligned contacts are planarized.

The present invention provides considerable improvement over the prior art. The spacers on the sidewalls of the conductive structure are not damaged during etching because the conductive layer for the contact is formed first and the spacers are never exposed to an etch. Also, since the conductive layer is being etched and not the dielectric layer, the etch only need reach the top of the conductive structures, not the substrate, reducing the amount of overetch required. Also, the process of the present invention is not limited to an advanced type of etching machine needed to cover the high reflected power which occurs in prior processes due to exceeding the RF match in the normal working area.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming a self aligned contact plug using a reverse self aligned contact etch process.

Figure 1:
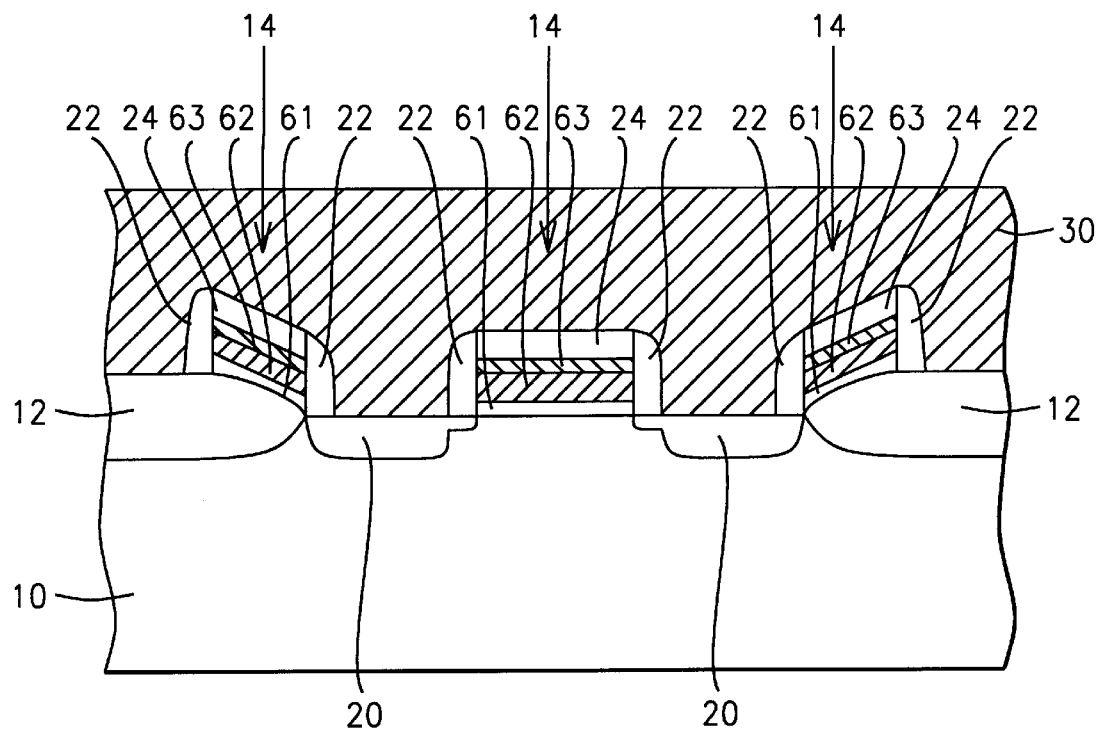
FIGS. 1, 2, 3, 4 & 5 illustrate sequential sectional views of a process for fabrication of a self aligned contact according to the invention.

As shown in FIG. 1, the process begins by providing a substrate structure (10). Preferably, the substrate structure (10) has isolation structures (12) thereon. The isolation structures can be field oxide regions or shallow trench isolations. Conductive structures (14) are formed on the substrate structure (10) and/or partially on the isolation structures (12). The conductive structures (14) can be any of a number of structures including, but not limited to: floating gate transistors, capacitors, word lines, or a combination thereof The present invention can be embodied in a variety of devices where conductive contacts are required to connect different levels of the device. The following description is for an N-type field effect transistor (NFET) and two word lines. The invention is applicable to any device such as MOS or bipolar.

Still referring to FIG. 1, a gate oxide layer (61) is formed on the substrate structure having a thickness of between about 50 Å and 100 Å. A first gate electrode layer (62) is formed on the gate oxide layer (61). The first gate electrode layer (62) is preferably compose of polysilicon having a thickness of between about 900 Å and 1100 Å. A silicide layer (63) is formed on the first gate electrode layer (62). The silicide layer is preferably composed of tungsten silicide having a thickness of between about 1000 Å and 1300 Å. A hard mask layer (24) is formed over the silicide layer (63). The hard mask layer can be composed of silicon oxynitride, TEOS oxide, or most preferably silicon nitride having a thickness of between about 1800 Å and 2100 Å.

Still referring to FIG. 1, the hard mask layer (24) the silicide layer (63), the first gate electrode layer (62), and the gate oxide layer (61); are patterned using photolithography and etching, thereby forming conductive structures (14) located between the isolation structures (12) and conductive structures (14) located partially over the isolation structures (12).

Still referring to FIG. 1, dielectric spacers (22) are formed on the sidewalls of the conductive structures (14). The dielectric spacers (22) are preferably composed of silicon nitride. The dielectric spacers can be formed by chemical vapor deposition and anisotropic etching. The dielectric spacers preferably have a thickness of between about 570 Å and 630 Å.

A key advantage of the present invention is that the dielectric spacer (22) is not exposed to an etch process because the conductive polysilicon layer (30) is deposited first. Therefore, the dielectric spacer (22) does not have to withstand the overetch associated with opening a contact hole over the doped regions (20) as in current self aligned contact processes.

Still referring to FIG. 1, impurity ions are implanted into the substrate structure (10) to form doped regions (20) adjacent to the conductive structures (14). Preferably As ions are implanted at an energy of between about 30 KeV and 40 KeV and at a dose of between about 1.0E15 atm/cm$^2$ and 4.7E15 atm/cm$^2$ to form N+ doped silicon, having an As ion concentration of between about 2.4E20 atm/cm$^3$ and 4.8E20 atm/cm$^3$.

In a key step, as shown in FIG. 1, a doped polysilicon layer (30) is formed over the conductive structures (14) and the doped regions (20). The doped polysilicon layer (30) is preferably doped in-situ using P ions at a concentration of between about 4E19 atm/cm$^3$ and 6E19 atm/cm$^3$. The doped polysilicon layer (30) has a thickness of between about 4000 Å and 5000 Å.

Figure 2:
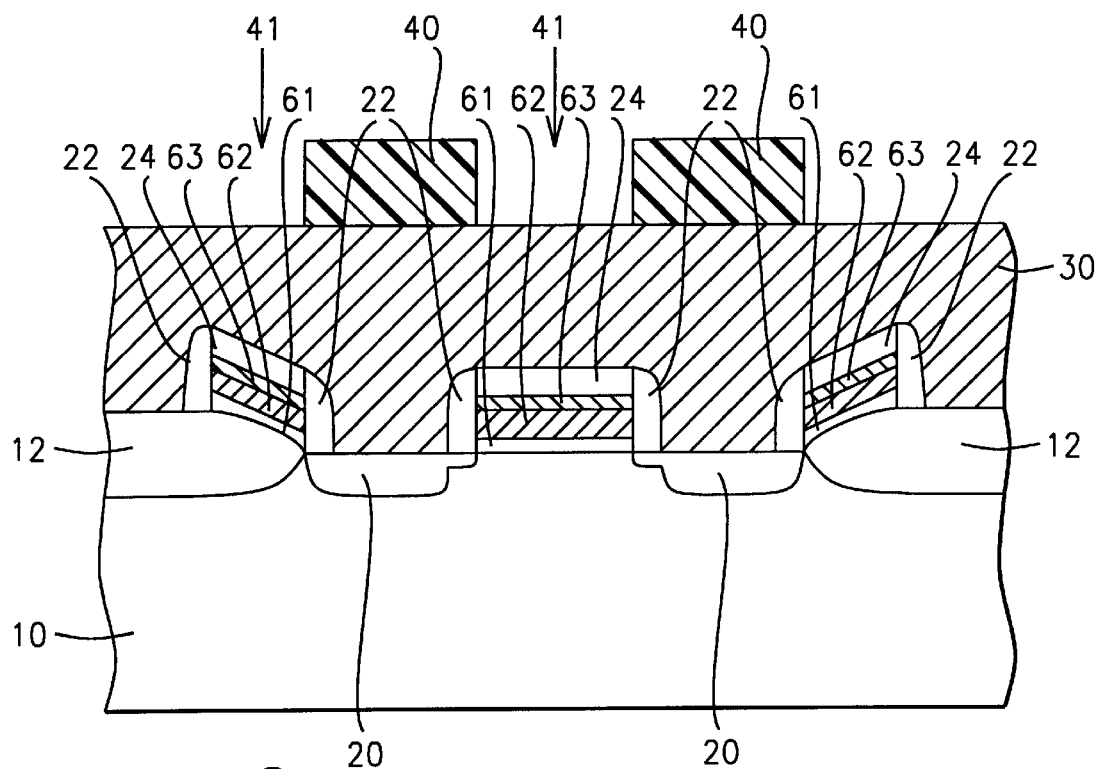

Referring to FIG. 2, a photoresist mask (40) is formed over the polysilicon layer (30) using photolithography. The photoresist mask (40) overlies the doped regions (20) plus a sufficient margin for process tolerances. The photoresist mask (40) has openings (45) which overlie the conductive structures (14).

Figure 3:
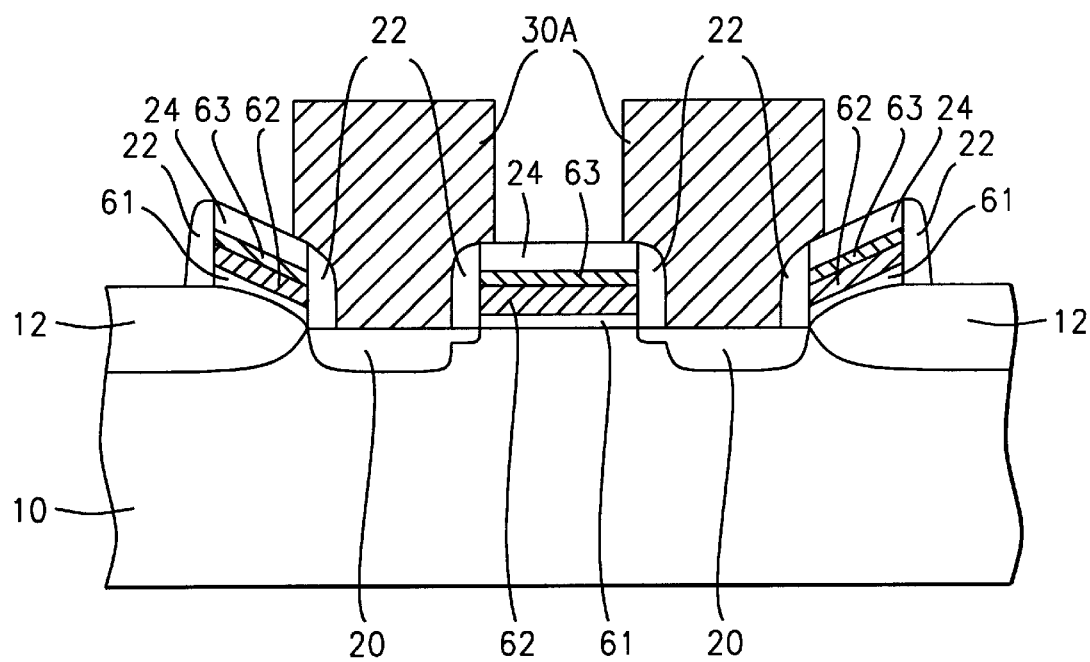

Referring to FIG. 3, the polysilicon layer (30) is etched through the openings (45) in the photoresist mask (40) to define self aligned contacts (30A) over the doped regions (20). The polysilicon layer (30) is preferably etched using a plasma etching process in a Lam TCP9400 etching machine, the like. The hard mask (24) can acts as an etch stop. The photoresist mask (40) is then removed.

An advantage of the present invention is that less overetch is required than with current processes. This is because the polysilicon layer (30) need only be etched to the top of the conductive structure (14) and not to the substrate (10) as in current self aligned contact etch processes. The reduced overetch provides higher reliability contacts.

Figure 4:
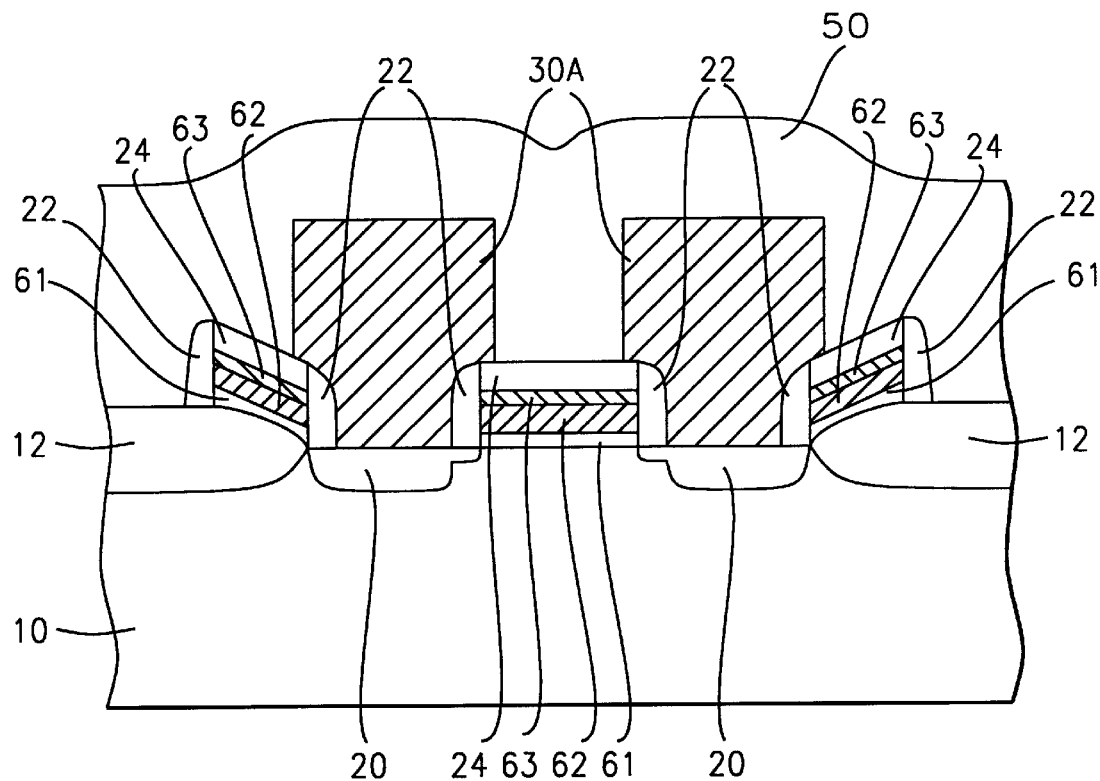

Referring to FIG. 4, a dielectric layer (50) is formed over the self aligned contacts (30A) and the conductive structures (14). The dielectric layer (50) is preferably composed of Boron and Phosphorous doped tetraethylorthosilicate oxide having a thickness of between about 4200 Å and 5750 Å. The Boron and Phosphorous doped tetraethylorthosilicate oxide is preferably formed at a temperature of between about 440° C. and 540° C. and at a pressure of between about 180 Torr and 220 Torr.

Figure 5:
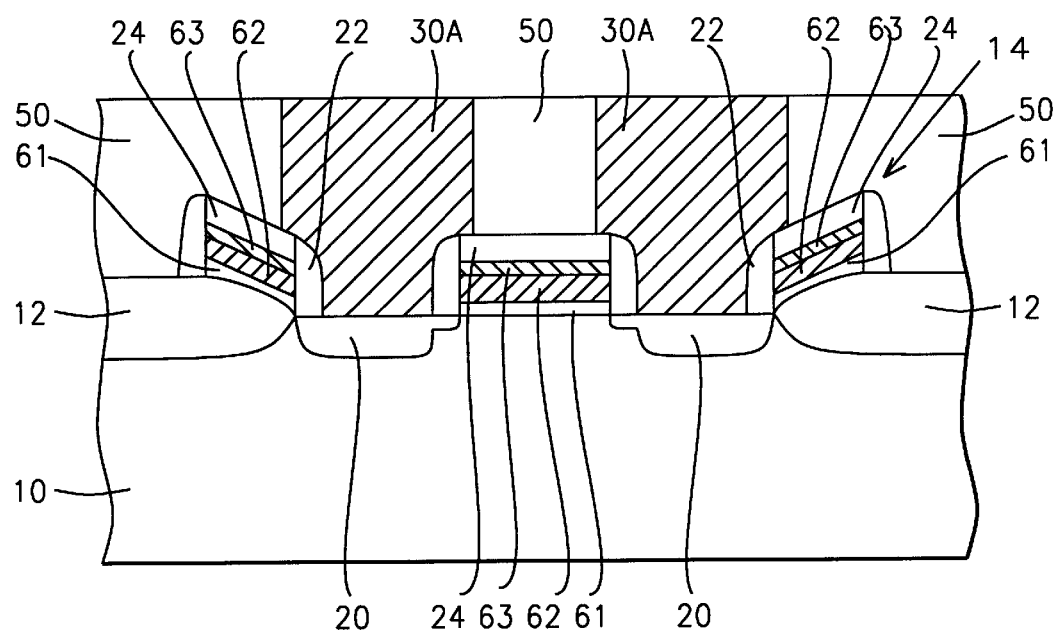

Referring to FIG. 5, the dielectric layer (50) and the self aligned contacts (30A) are planarized. Either chemical mechanical polishing or an etch back process can be used for the planarization.

The key advantages of the present invention are that it avoids the problem of spacer (22) damage during self aligned contact etch, and reduces the overetch required providing a larger processing window.

While the invention has been particularly shown and described with reference to the preferred embodiments thereof, it will be understood by those skilled in the art that various changes in form and details may be made without departing from the spirit and scope of the invention. For example, while the device described is an N-type device, a P-type device can be fabricated by using impurity ions having the opposite polarity.

What is claimed is:

1. A method for fabricating a self aligned contact using a reverse contact etch process, comprising the steps of:
   a. providing a substrate structure having conductive structures thereon; said conductive structures having tops with hard masks thereon and sidewalls with dielectric spacers thereon; said substrate structure having doped regions thereon adjacent to one or both sides of said conductive structures;
   b. forming a polysilicon layer extending over said conductive structures and said doped regions;
   c. forming a photoresist mask over said polysilicon layer; said photoresist mask having openings at least over said conductive structures and over areas where contacts are desired;
   d. etching said polysilicon layer through said openings in said photoresist mask stopping on said hard masks to form self aligned contacts over said doped regions; and removing said photoresist mask;
   e. forming a dielectric layer over said self aligned contacts and said conductive structures; and
   f. planarizing said dielectric layer to expose said self aligned contacts and wherein said dielectric layer remains over said conductive structures and wherein said self aligned contacts have a height taller than said conductive structures.

2. The method of claim 1 wherein said conductive structures are floating gate transistors.

3. The method of claim 1 wherein said dielectric spacer is composed of silicon nitride.

4. The method of claim 1 wherein said hard mask is composed of silicon nitride having a thickness of between about 1800 Å and 2100 Å.

5. The method of claim 1 wherein said doped regions are N+ doped silicon, doped with As ions at a concentration of between about 2.4E20 atm/cm$^3$ and 4.8E20 atm/cm$^3$.

6. The method of claim 1 wherein said polysilicon layer is doped in-situ using P ions at a concentration of between about 4E19 atm/cm$^3$ and 6E19 atm/cm$^3$.

7. The method of claim 1 wherein said polysilicon layer is etched using a plasma etching process and said hard mask acts as an etch stop.

8. The method of claim 1 wherein said dielectric layer is composed of Boron and Phosphorous doped tetraethylorthosilicate oxide formed at a temperature of between about 440° C. and 540° C. and at a pressure of between about 180 Torr and 220 Torr.

9. A method for fabricating a self aligned contact using a reverse contact etch process, comprising the steps of:
   a. providing a substrate structure having isolation structures thereon;
   b. forming a gate oxide layer on said substrate structure;
   c. forming a first gate electrode on said gate oxide layer;
   d. forming a silicide layer over said first gate electrode layer;
   e. forming a hard mask layer over said silicide layer;
   f. patterning said hard mask layer said silicide layer, said first gate electrode layer, and said gate oxide layer; thereby forming conductive structures located between said isolation structures and conductive structures located partially over said isolation structures;
   g. forming dielectric spacers on said sidewalls of said conductive structures;
   h. implanting impurity ions to form doped regions;
   i. forming a doped polysilicon layer over said conductive structures and said doped regions; said doped polysilicon layer having a thickness of between about 4000 angstroms and 5000 angstroms;
   j. forming a photoresist mask over said polysilicon layer; said photoresist mask overlying said doped regions;
   k. etching said polysilicon layer where said polysilicon layer is not covered by said photoresist mask to form self aligned contacts over said doped regions and removing said polysilicon layer over said conductive structures and removing said photoresist mask;
   l. forming a dielectric layer composed of Boron and Phosphorous doped tetraethylorthosilicate oxide over said self aligned contacts and said conductive structures; and
   m. planarizing said dielectric layer to expose said self aligned contacts and wherein said dielectric layer remains over said conductive structures and wherein said self aligned contacts have a height taller than said conductive structures.

10. The method of claim 9 wherein said conductive structures located between said isolation structures are negative field effect transistors and said conductive structures located partially over said isolation structures are word lines.

11. The method of claim 9 wherein said dielectric spacer is composed of silicon nitride having a thickness of between about 570 Å and 630 Å.

12. The method of claim 9 wherein said hard mask is composed of silicon nitride having a thickness of between about 1800 Å and 2100 Å.

13. The method of claim 9 wherein said doped regions are N+ doped silicon, doped with As ions at a concentration of between about 2.4E20 atm/cm$^3$ and 4.8E20 atm/cm$^3$.

14. The method of claim 9 wherein said polysilicon layer is doped in-situ using P ions at a concentration of between about 4E19 atm/cm$^3$ and 6E19 atm/cm$^3$.

15. The method of claim 9 wherein said polysilicon layer is etched using a plasma etching process and said hard mask acts as an etch stop.

16. The method of claim 9 wherein said dielectric layer is composed of Boron and Phosphorous doped tetraethylorthosilicate oxide formed at a temperature of between about 440° C. and 540° C. and at a pressure of between about 180 Torr and 220 Torr.

* * * * *